United States Patent

Choi

(10) Patent No.: US 10,345,393 B2
(45) Date of Patent: Jul. 9, 2019

(54) POWER LOSS MEASURING SYSTEM FOR MEASURING POWER LOSS AT HARMONIC FILTER INCLUDED IN HIGH VOLTAGE DIRECT CURRENT (HVDC) TRANSMISSION SYSTEM, AND POWER LOSS MEASURING METHOD THEREOF

(71) Applicant: LSIS CO., LTD., Gyeonggi-do (KR)

(72) Inventor: Yong Kil Choi, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 373 days.

(21) Appl. No.: 15/214,190

(22) Filed: Jul. 19, 2016

(65) Prior Publication Data

US 2017/0030978 A1    Feb. 2, 2017

(30) Foreign Application Priority Data

Jul. 30, 2015  (KR) .......................... 10-2015-0108401

(51) Int. Cl.
| | | |
|---|---|---|
| G01R 31/42 | (2006.01) | |
| G01R 31/40 | (2014.01) | |
| H02J 3/01  | (2006.01) | |
| H02J 3/36  | (2006.01) | |

(52) U.S. Cl.
CPC ............... *G01R 31/40* (2013.01); *H02J 3/01* (2013.01); *H02J 3/36* (2013.01); *H02J 2003/365* (2013.01); *Y02E 40/40* (2013.01); *Y02E 60/60* (2013.01)

(58) Field of Classification Search
CPC .... G01R 31/40; H02J 3/01; H02J 3/36; Y02E 40/40; Y02E 60/60

USPC ...................................................... 324/764.01
See application file for complete search history.

(56) References Cited

U.S. PATENT DOCUMENTS

| | | |
|---|---|---|
| 5,731,965 A | 3/1998 | Cheng et al. |
| 6,907,460 B2 | 6/2005 | Loguinov et al. |
| 7,792,121 B2 | 9/2010 | Thompson et al. |
| 2012/0095613 A1 | 4/2012 | Tsuda |
| 2016/0049880 A1 | 2/2016 | Kim et al. |

FOREIGN PATENT DOCUMENTS

| | | |
|---|---|---|
| CN | 1815247 A | 8/2006 |
| CN | 102074951 A | 5/2011 |
| CN | 104698265 A | 6/2015 |

(Continued)

OTHER PUBLICATIONS

Taffese et al., Modular Multilevel Converter with Tuned Filter: Operational Possibility and Simple Control, IEEE (2014) pp. 1-6.

(Continued)

*Primary Examiner* — Melissa J Koval
*Assistant Examiner* — Courtney G McDonnough
(74) *Attorney, Agent, or Firm* — K&L Gates LLP (57) ABSTRACT

A power loss measuring system is provided for measuring power loss in a harmonic filter included in a High Voltage Direct Current (HVDC) transmission system. The power loss measuring system may include a harmonic filter, a monitoring sensing unit, and a controller. The harmonic filter may include a plurality of elements. The monitoring sensor unit may sense variation in impedance of each of the plurality of elements. The controller may obtain power loss in the harmonic filter using amount of variation in impedance of each of the plurality of elements.

18 Claims, 6 Drawing Sheets

(56) References Cited

FOREIGN PATENT DOCUMENTS

| | | |
|---|---|---|
| DE | 19838111 | 3/2000 |
| JP | H04-87523 A | 3/1992 |
| JP | H11-55857 A | 2/1999 |
| JP | 2012-105523 A | 5/2012 |
| KR | 10-2001-0102505 A | 11/2001 |
| KR | 10-2002-0087940 A | 11/2002 |
| KR | 10-2003-0064828 A | 8/2003 |
| KR | 10-2004-0062893 A | 7/2004 |
| KR | 10-0666509 B1 | 1/2007 |
| KR | 10-0883502 B1 | 2/2009 |
| KR | 10-1149906 B1 | 6/2012 |
| KR | 10-1425400 B1 | 8/2014 |
| WO | WO 97/49167 | 12/1997 |
| WO | WO 97/49168 | 12/1997 |
| WO | WO 2012/000510 | 1/2012 |

OTHER PUBLICATIONS

Li et al., Simulation of the Electromagnetic Response Characteristic of an Inductively Filtered HVDC Converter Transformer Using Field-Circuit Coupling, IEEE Transactions on Industrial Electron (2012) 59:11 pp. 4020-4031.
Dec. 14, 2016 Extended European Search Report for European App. No. 16163648.5.
Chinese Office Action for related Chinese Application No. 201610618995.7; action dated Jul. 6, 2018; (7 pages).

FIG. 1

PRIOR ART

POWER LOSS MEASURING SYSTEM FOR MEASURING POWER LOSS AT HARMONIC FILTER INCLUDED IN HIGH VOLTAGE DIRECT CURRENT (HVDC) TRANSMISSION SYSTEM, AND POWER LOSS MEASURING METHOD THEREOF

CROSS-REFERENCE TO RELATED APPLICATIONS

This application claims the benefit of Korean Patent Application No. 10-2015-0108401, filed on Jul. 30, 2015, which is incorporated by reference in its entirety.

BACKGROUND

The present disclosure relates to power loss measuring system for measuring power loss in a harmonic filter using variation in impedance of each element included in the harmonic filter, and a power losing measuring method thereof.

High Voltage Direct Current (HVDC) transmission indicates a power transmission method of converting, by a transmission site, alternative current (AC) power produced at a power station into direct current (DC) power to transmit the DC power and then re-converting, by a reception site, the DC power into the AC power to supply power. The HVDC transmission may enable efficient and economical power transmission through a voltage increase that is the advantage of AC transmission. In addition, the HVDC transmission may overcome many limitations of the Ac transmission.

In such HVDC transmission, it is essential to convert AC power into DC power and then the DC power into Ac power. However, harmonics occur due to characteristics of a switch and a load during the conversion, and therefore, a harmonic filter is generally used to prevent harmful effects of the harmonics.

Figure 1:
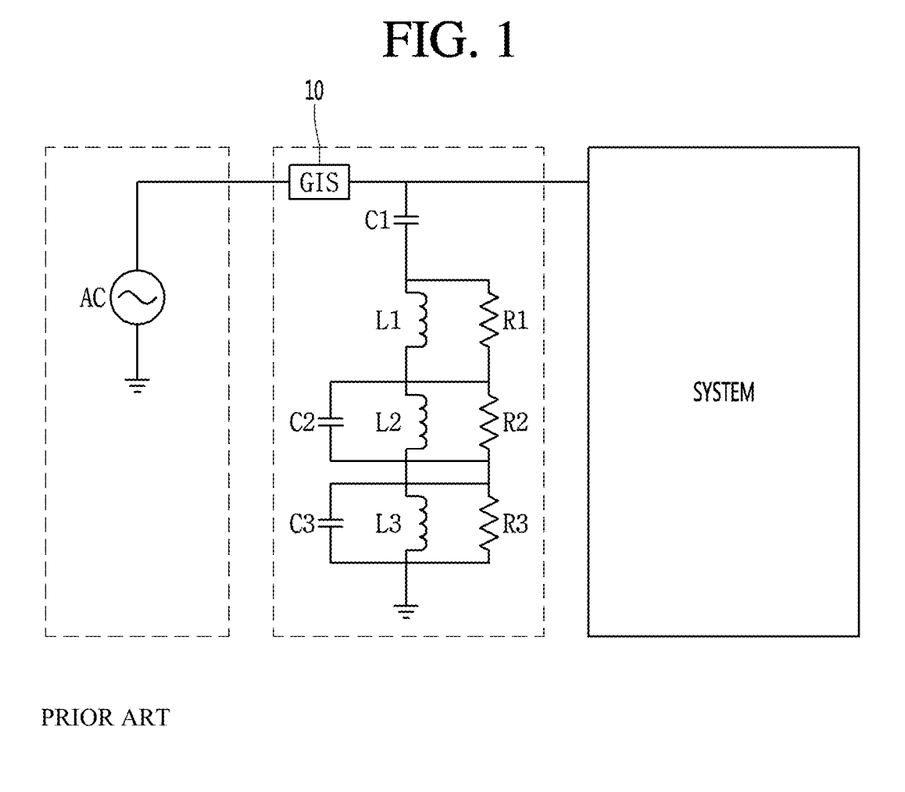
FIG. 1 is a diagram illustrating a method for measuring power loss in an existing harmonic filter, according to the prior art.

A general configuration of the harmonic filter is as shown in FIG. 1.

Referring to FIG. 1, the harmonic filter includes at least one inductor, at least one capacitor, and at least one resistor. Conventionally, to measure power loss occurring at a harmonic filter, a voltage and a current are measured in a Gas Insulated Switchgear (GIS) 10 disposed in a receiver of the harmonic filter. That is, the power loss occurring at the harmonic filter is conventionally calculated using voltage and current values measured by the receiver of the harmonic filter.

However, an existing system for measuring power loss in a harmonic filter aims mainly to measure voltage and current, rather than the power loss itself. In addition, it is hard to measure power loss according to a real-time change in temperature and frequency because variation in impedance according to a change in temperature and frequency is not known. Further, power loss of each element cannot be measured, and variation in impedance according to a change in a voltage and a current is not known, so that they cannot be reflected in the system design.

SUMMARY

The present disclosure is provided to solve the aforementioned drawbacks, and relates to power loss measuring system, which measures a loss in a harmonic filter based on variation in impedance of each element of the harmonic element, and power loss measuring method thereof.

According to one embodiment of the present disclosure, there is provided a power loss measuring system for measuring power loss in a harmonic filter included in a High Voltage Direct Current (HVDC) transmission system, the power loss measuring system including: the harmonic filter including a plurality of elements; a monitoring sensor unit sensing variation in impedance of the plurality of elements; and a controller obtaining power loss in the harmonic filter using amount of variation in impedance of the plurality of elements.

The plurality of elements may include at least one resistor, at least one capacitor, and at least one inductor; the monitoring sensor unit may sense variation in impedance of each of the at least one resistor, the at least one capacitor, and the at least one inductor; and the controller may obtain power loss occurring in each of the at least one resistor, the at least one capacitor, and the at least one inductor based on the amount of variation in impedance of each of the at least one resistor, the at least one capacitor, and the at least one inductor.

The monitoring sensor unit may obtain the amount of variation in impedance using an impedance value, which is sensed by the monitoring sensor unit, and an initial impedance value of each of the at least one resistor, the at least one capacitor, and the at least one inductor.

Impedance of the plurality of elements may be changed due to at least one of a change in temperature and a change in frequency of the plurality of elements.

The controller may obtain the power loss in the harmonic filter using variation in impedance of each of the plurality of elements and at least one of a rated voltage and a rated current of each of the plurality of elements.

The rated voltage of each of the plurality of elements may be a fixed value.

The controller may include a communication module communicating with a server, calculate at least one of amount of the power loss in each of the plurality of elements and amount of the power loss in the harmonic filter based on the amount of variation in impedance of each of the plurality of elements, and transmit the at least one of the amount of the power loss in each of the plurality of elements and the power loss in the harmonic filter via the communication module to the server.

The monitoring sensor unit may comprise a communication module communicating with a server and transmit the amount of variation in impedance of each of the plurality of elements via the communication module to the server.

The power loss measuring system may further include a storage, wherein the controller stores, in the storage, at least one of an initial impedance value of each of the plurality of elements, amount of variation in impedance of each of the plurality of elements, amount of power loss occurring in each of the plurality of elements, and amount of power loss occurring in the harmonic filter.

The monitoring sensor unit may sense an impedance value of each of the plurality of elements and transmit the sensed impedance value of each of the plurality of elements to the controller, and the controller may calculate amount of variation in impedance of each of the plurality of elements based on the received impedance value of each of the plurality of elements.

According to another aspect of the present disclosure, there is provided a power loss measuring method of power loss measuring system for measuring power loss in a harmonic filter included in a High Voltage Direct Current (HVDC) transmission system, the power loss measuring method including: sensing impedance values of a plurality of elements included in the harmonic filter; obtaining variation in impedance of the plurality of elements; and obtaining power loss in the harmonic filter using amount of variation in impedance of the plurality of elements.

The plurality of elements may include at least one resistor, at least one capacitor, and at least one inductor; the obtaining of variation in impedance of the plurality of elements may include calculating variation in impedance of each of the at least one resistor, the at least one capacitor, and the at least one inductor; and the obtaining of power loss in the harmonic filter may include calculating power loss occurring in each of the at least one resistor, the at least one capacitor, and the at least one inductor based on the amount of variation in impedance of each of the at least one resistor, the at least one capacitor, and the at least one inductor.

DETAILED DESCRIPTION

The present disclosure will now be described more fully with reference to the accompanying drawings, in which embodiments of the present disclosure are shown. Like reference numerals in the drawings, even in different drawings, denote like elements. Throughout the drawings and the detailed description, unless otherwise described, the same drawing reference numerals are understood to refer to the same elements, features, and structures. In the following, the terms "module" and "unit" are used for convenience of descriptions, not for distinction or difference of elements. Hereinafter, in describing the present disclosure, detailed descriptions of relevant functions or structures well-known to those skilled in the art will be omitted when it is considered that the descriptions obscure the point of the present disclosure. The present disclosure is described more fully hereinafter with reference to the accompanying drawings, in which embodiments of the present disclosure are shown. This disclosure may, however, be embodied in many different forms and should not be construed as limited to the embodiments set forth herein. It should be understood, however, that there is no intent to limit the disclosure to the particular forms disclosed, but on the contrary, the disclosure is to cover all modifications, equivalents, and alternatives falling within the spirit and scope of the disclosure as defined by the claims.

Figure 2:
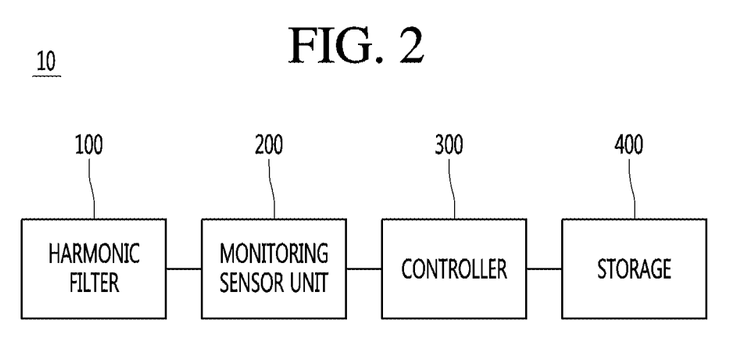
FIG. 2 is a block diagram illustrating a configuration of power loss measuring system according to an embodiment of the present disclosure.

FIG. 2 is a block diagram illustrating a loss power measuring system according to an embodiment of the present disclosure.

Referring to FIG. 2, power loss measuring system 10 according to the present disclosure may include a harmonic filter 100, a monitoring sensor 200, a controller 300, and a storage 400.

The harmonic filter 100 may remove harmonics occurring in a High Voltage Direct Current (HVDC) system. Specifically, in a HVDC transmission method, a thyristor converter is used to convert AC power into DC power, and harmonics occur during the conversion due to characteristics of the thyristor converter that controls a phase. In addition, the harmonic filter 100 may remove the harmonics that occur during the conversion.

The harmonic filter 100 may include a plurality of elements. Specifically, the harmonic filter 100 may include a capacitive element, an inductive element, and a resistor, and may remove n-th harmonics that occur when AC power is rectified.

A capacitor may be used as the capacitive element, and an inductor may be used as the inductive element.

The harmonic filter 100 installed in a transceiver of the HVDC system may remove harmonics occurring when AC power is converted into DC power. In addition, the harmonic filter 100 installed in a receiver of the HVDC system may remove harmonics occurring when DC power is converted into AC power. Furthermore, the harmonic filter 100 may improve a power factor by supplying reactive power to the HVDC system.

The monitoring sensor unit 200 may sense variation in impedance of a plurality of devices. Specifically, the monitoring sensor unit 200 may include a plurality of monitoring sensors which correspond to the number of a capacitive element(s), an inductive element(s), and a resistor(s) included in the harmonic filter 100, and may sense an impedance value of each of the capacitive element(s), the inductive element(s), and the resistor(s) included in the harmonic filter 100. In addition, the plurality of monitoring sensors obtain amount of variation in impedance using the sensed impedance value, and transmit the obtained amount of variation in impedance to the controller 300. In this case, each monitoring sensor may calculate the amount of variation in impedance based on the initial impedance value that each capacitive element, inductive element, and resistor has in a specific condition.

Each monitoring sensor may include a sensing module for sensing impedance of an element, a calculation module for calculating amount of variation in impedance of an element, a communication module for transmitting the calculated amount of variation in impedance to the controller 300.

Meanwhile, each of the plurality monitoring sensor included in the monitoring sensor unit 200 calculates amount of variation in impedance in the above-described embodiment, but aspects of the present disclosure are not limited thereto. Specifically, each of the plurality of monitoring sensors may consist of a sensing component for sensing impedance value of an element and a communicating component for transmitting the sensed impedance value to the controller 300, and amount of variation in impedance may be calculated by the controller 300.

The controller 300 may measure amount of variation in impedance of a plurality of elements. Specifically, when receiving information on an impedance value of each of the plurality of elements from the monitoring sensor unit 200, the controller 300 may calculate amount of variation in impedance using the received information. More specifically, the controller 300 stores, in the storage 400, an initial impedance value that each capacitive element, inductive element, or resistor has in a specific condition. Then, the controller 300 compares a receive impedance value with a stored initial impedance value to calculate amount of variation in impedance of each element.

In addition, based on amount of variation in impedance of each element, the controller 300 may calculate power loss occurring at the harmonic filter 300. Specifically, by calculating variation in power loss occurring in each element based on calculated amount of variation in impedance of each element included in the harmonic filter 100, the controller 300 may calculate amount of variation in power loss occurring in the harmonic filter 100. In addition, by calculating amount of variation in power loss occurring in each element based on received variation in impedance of each element from the monitoring sensor unit 200, the controller 300 may calculate the amount of variation in the entire power loss occurring in the harmonic filter 100.

The storage 400 is under control of the controller 300 and may store at least one of the following: an initial impedance value of each element included in the harmonic filter 100, amount of variation in impedance, amount of power loss occurring in each element, and amount of an entire power loss occurring in the harmonic filter 100.

Figure 3:
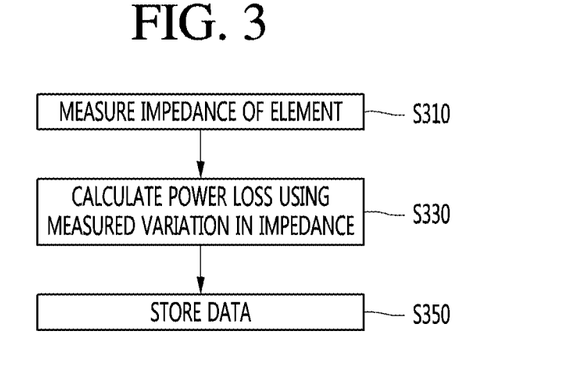
FIG. 3 is a flowchart illustrating power loss measuring method of power loss measuring system according to an embodiment of the present disclosure.

FIG. 3 is a flowchart illustrating power loss measuring method of power loss measuring system according to an embodiment of the present disclosure.

Referring to FIG. 3, power loss measuring method of power loss measuring system according to an embodiment of the present disclosure may include measuring impedance of a plurality of elements (s310), calculating power loss in a harmonic filter based on amount of variation in impedance of the plurality of elements (S330), and storing data (S350).

Measuring impedance of the plurality of elements in step 310 is described in detail with reference to FIG. 4.

Figure 4:
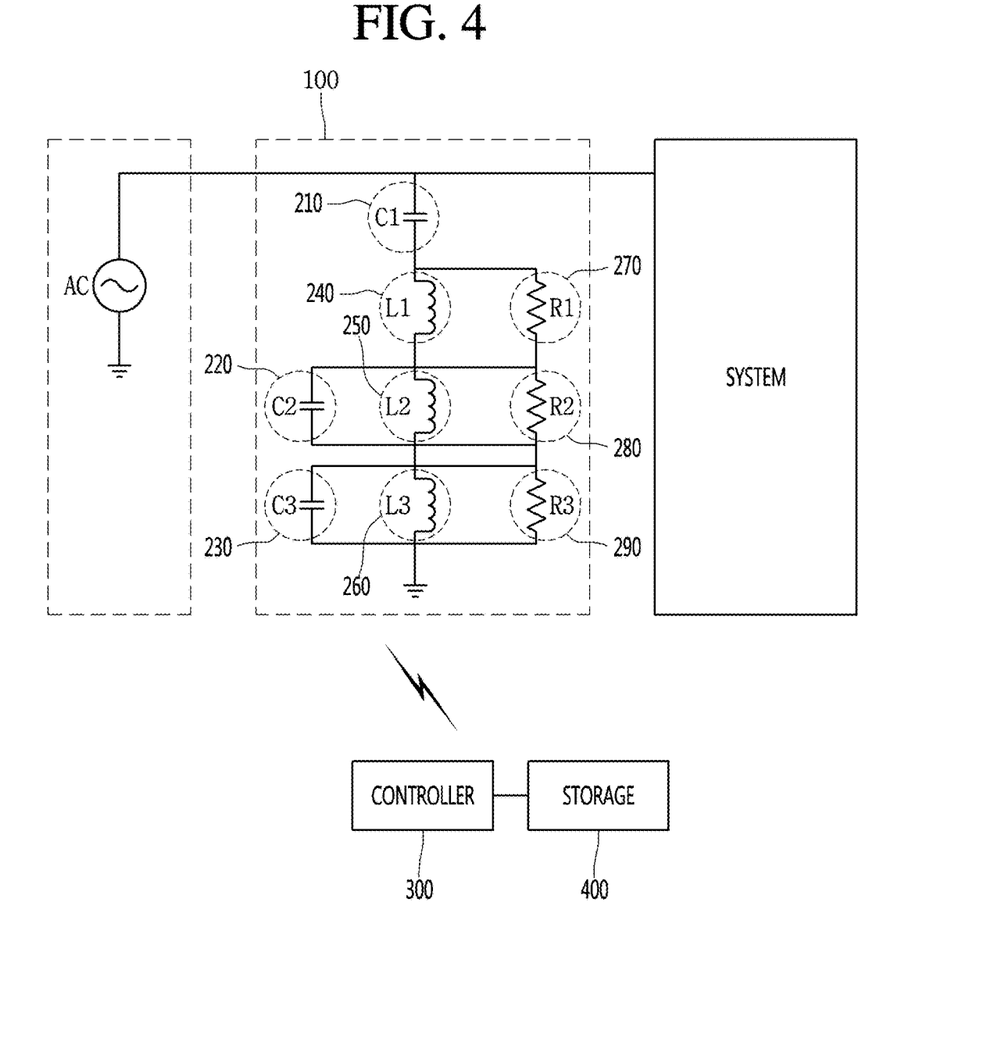
FIG. 4 is a diagram for explanation of a method for measuring power loss in each element included in a harmonic filter according to an embodiment of the present disclosure.

FIG. 4 is a diagram for explanation of a method for measuring power loss in each of a plurality of elements included in a harmonic filter according to an embodiment of the present disclosure.

Referring to FIG. 4, a harmonic filter 100 may include a plurality of elements. Specifically, as shown in FIG. 4, the harmonic filter 100 may include a plurality of capacitors C1, C2, and C3, a plurality of inductors L1, L2, and L3, and a plurality of resistors R1, R2, and R3, and may remove harmonics equal to higher than a reference level by using a combination of the capacitors, inductors, and resistors. Meanwhile, FIG. 4 shows a harmonic filter including three capacitors, three inductors, and three resistors, but aspects of the present disclosure are not limited thereto. That is, a harmonic filter of the present disclosure may be any filter which is able to remove harmonics by using various combinations of at least one capacitor, at least one inductor, and at least one resistor.

Meanwhile, the plurality of capacitors C1, C2, and C3, the plurality of inductors L1, L2, and L3, and the plurality of resistors R1, R2, and R3 have impedance values, respectively, and the impedance values are able to be changed. Specifically, the impedance values may be changed according to a voltage or a current frequency. In addition, if there is a change in temperature, an impedance value may be changed according to characteristics of an element.

Meanwhile, power loss in each element may be calculated using a change in frequency and temperature, a voltage value, and a current value. However, these values are often changed so accurate measurements thereof are hard to obtain. However, as proposed in the present disclosure, if amount of variation in impedance of each element where power loss occurs, it is possible to calculate the power loss.

A plurality of sensors 210, 220, 230, 240, 250, 260, 270, 280, 290 included in the monitoring sensor unit 200 may measure impedance of a plurality of capacitors C1, C2, and C3, impedance of a plurality of inductors L1, L2, and L3, and a plurality of resistors R1, R2, and R3, respectively. In addition, the plurality of sensors 210, 220, 230, 240, 250, 260, 270, 280, and 290 senses not only amount of variation in impedance of each of a plurality of elements, but also a voltage and current applied to each of the plurality of elements and frequency and temperature of each of the plurality of elements, so that the controller 300 may be enabled to monitor a voltage and a current of each element based on a combination thereof and improve accuracy in calculation of power loss. However, in power loss measuring method proposed in the present disclosure, it is possible to measure power loss in each element based solely on a change in an impedance value, and thus, it is not essential to measure a voltage and a current.

The amount of variation in impedance may be a difference between an initial impedance value and a current impedance value of an element. Specifically, the plurality of sensors 210, 220, 230, 240, 250, 260, 270, 280, and 290 may store initial impedance values of respective elements. Here, an initial impedance value may be an impedance value that an element has in a basic condition (basic frequency, basic temperature, basic voltage, and basic current). In addition, the plurality of sensors 210, 220, 230, 240, 250, 260, 270, 280, and 290 may calculate amount of variation in impedance by sensing impedance values of the respective elements and comparing the sensed impedance values with initial impedance values of the respective elements.

Meanwhile, without storing the initial impedance values for calculation of variation in impedance, the plurality of sensors 210, 220, 230, 240, 250, 260, 270, 280, and 290 may transmit impedance values measured by the plurality of elements to the controller 300. In this case, the controller 300 may calculate amount of variation in impedance. Alternatively, the impedance values measured by the plurality of elements may be used to calculate power loss in each element without calculating amount of variation in impedance by the controller 300.

Each of the plurality of sensors 210, 220, 230, 240, 250, 260, 270, 280, and 290 may include a storage module for storing an initial impedance value of a corresponding element, and a calculation module for calculating amount of variation in impedance of a corresponding element. In addition, each of the plurality of sensors 210, 220, 230, 240, 250, 260, 270, 280, and 290 may include a communication module for transmitting amount of variation in impedance or an impedance value of each element.

Using variation in impedance of the plurality of elements, the controller 300 may calculate power loss in a harmonic filter. Specifically, using each element's amount of variation in impedance transmitted from the plurality of sensors 210, 220, 230, 240, 250, 260, 270, 280, and 290, the controller 300 may calculate amount of variation in power loss in each element. The amount of power loss in each element may be calculated as the following formula:

$$\text{Variation In Power Loss } [\Delta W] = \Delta Z * I^2$$

The current value I in each element is a fixed value according to a rated current of the system. Thus, using the fixed current value I and the value of variation of impedance $\Delta Z$, it is possible to measure variation in power loss in an element.

That is, the controller 300 may calculate variation in amount of power loss ΔW in each of the plurality of elements (the capacitors C1, C2, and C3, the inductors L1, L2, and L3, and the resistors R1, R2, and R3) by using amount of variation in impedance and a rated current value of each of the plurality of the elements (the capacitors C1, C2, and C3, the inductors L1, L2, and L3, and the resistors R1, R2, and R3).

In addition, the voltage value v of each element is a fixed value according to a rated voltage of the system. Thus, the current value I may be calculated using the fixed voltage value v and an impedance value in each element, and amount of variation in power loss ΔW in each element may be calculated using the current value I and the amount of variation in impedance ΔZ.

In addition, variation in power loss in each element may be calculated as the following formula:

$$\text{Variation In Power Loss } [\Delta W] = V^2/\Delta Z$$

The voltage value v in each element is a fixed value according to a rated voltage of the system, and amount of variation in power loss ΔW in each element may be calculated using the fixed voltage value v and the amount of variation in impedance ΔZ.

In addition, using variation in impedance and a rated voltage of each of the plurality of elements (the capacitors C1, C2, and C3, the inductors L1, L2, and L3, and the resistors R1, R2, and R3), the controller 300 may calculate amount of variation in power loss ΔW in each element.

In addition, using the variation in power loss ΔW in each element, the controller 300 may calculate amount of variation in the entire power loss that occurs in the harmonic filter 100.

Meanwhile, in this embodiment, amount of variation in power loss ΔW are calculated using amount of variation in impedance ΔZ, so the amount of variation in power loss ΔW calculated in this embodiment may be an amount of power loss that is changed from amount of power loss which occurs in a basic condition (basic frequency, basic temperature, basic voltage, and basic current).

Meanwhile, this embodiments is a case where the controller 300 calculate amount of variation in power loss in each element based on amount of variation in impedance in each element, which is received from each of the plurality of sensors 210, 220, 230, 240, 250, 260, 270, 280, and 290, but aspects of the present disclosure are not limited thereto. For example, the plurality of sensors 210, 220, 230, 240, 250, 260, 270, 280, and 290 may sense impedance value of each of the plurality of elements and transmit the sensed impedance value to the controller 300, and then the controller 300 may calculate amount of variation in impedance of each element by using an initial impedance value of each element, which is stored in the storage 400, and may calculate amount of variation in power loss in each element by using the calculated amount of variation in impedance and a rated voltage of each element.

Meanwhile, based on impedance of each of the plurality of elements, the controller 300 may calculate power loss in a harmonic filter. Specifically, based on impedance value of each of the plurality of elements, which are transmitted from the plurality of sensors 210, 220, 230, 240, 250, 260, 270, 280, and 290, the controller 300 may calculate amount of power loss in each of the plurality of elements. The amount of power loss in each element may be calculated as the following formula:

$$\text{Power Loss } [W] = |Z| \ast I^2$$

In addition, the power loss in each element may be calculated as the following formula:

$$\text{Power Loss } [W] = V^2/|Z|$$

The calculated power loss W may be strengthen amount of power loss. Specifically, the power loss W is calculated using the magnitude of impedance |Z| in this embodiment, so the power loss W may be an absolute value of power loss occurring in each of the plurality of elements.

In addition, using the amount of power loss in each element, the controller 300 may calculate power loss occurring in the entire harmonic filter 100.

Meanwhile, the controller 300 may store calculated data in the storage 400. Specifically, the controller 300 may store, in the storage 400, at least one of the following: a voltage value of each element, a current value of each element, temperature of each element, a frequency of each element, an impedance value of each element, amount of variation in impedance of each element, amount of power loss in each element, and amount of variation in power loss in each element, wherein the aforementioned data items are transmitted from the monitoring sensor unit 200. In addition, the controller 300 may store, in the storage 400, time information which includes at least one measurement of the following: a voltage value of each element, a current value of each element, temperature of each element, a frequency of each element, an impedance value of each element, amount of variation in impedance of each element, amount of power loss in each element, and variation in power loss in each element. In addition, the stored data may be used to monitor the plurality of elements and design the system.

Figure 5A:
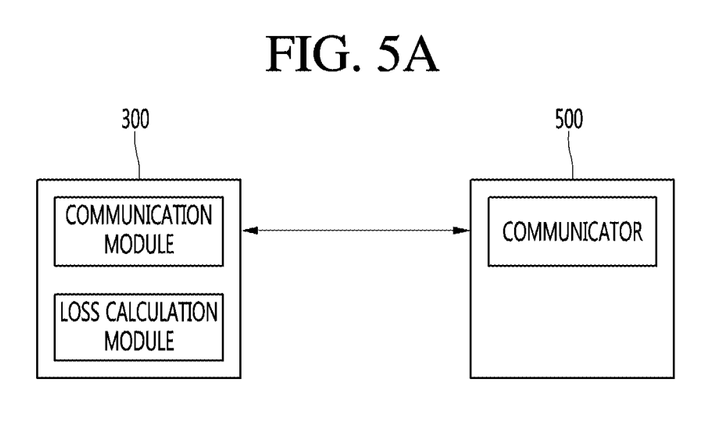
FIG. 5a is a diagram for explanation of a method for transmitting data to a server according to an embodiment of the present disclosure.

FIG. 5 is a diagram for explanation of a method of transmitting data to a server according to an embodiment of the present disclosure.

Referring to FIG. 5A, through an embedded communication module, a controller 300 may transmit, to a server 500, at least one of the following: a voltage value of each element, a current value of each element, temperature of each element, a frequency of each element, an impedance value of each element, amount of variation in impedance of each element, amount of power loss in each element, and amount of variation in power loss in each element, wherein the voltage value, current value, temperature, frequency, impedance value, and amount of variation in impedance are transmitted from a plurality of elements included in a monitoring sensor unit 200, and the amount of power loss in each element and the amount of variation in power loss in each element are calculated by power loss calculation module. Here, the server 500 may be a server of a company providing power in an HVDC system or a server of an operator managing provided power via the HVDC system. Such an operator or company may monitor power loss occurring in each element of a harmonic filter based on information received from the controller 300.

Figure 5B:
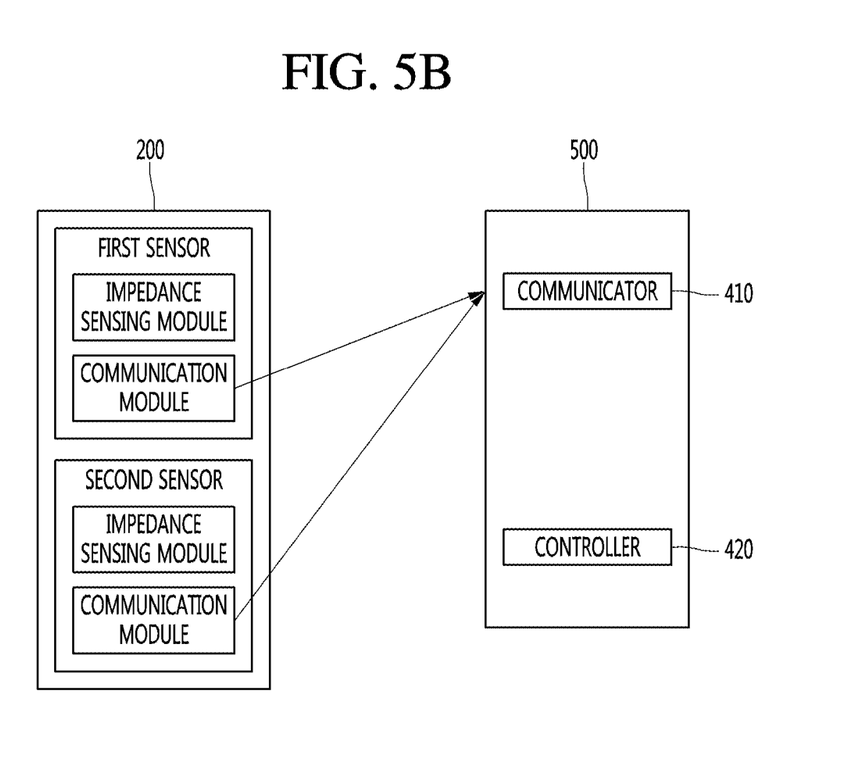
FIG. 5b is a diagram for explanation of an example in which a monitoring sensor unit and a server communicate with each other directly without a procedure in which a controller calculates power loss, according to an embodiment of the present disclosure.

FIG. 5b is a diagram for explanation of an example in which a monitoring sensor unit and a server communicate with each other directly without a procedure in which a controller calculates power loss.

Referring to FIG. 5b, each sensor of a monitoring sensor unit 200 may include not just an impedance sensing module, but also a communication module. In addition, each sensor of the monitoring sensor unit 200 may communicate directly with a server 500. Specifically, using the communication modules, the monitoring sensor unit 200 may transmit, to the server 500, at least one of the following: a voltage value each element, a current value, temperature, frequency, impedance value, and amount of variation in impedance in each element.

The server 500 may receive data from the monitoring sensor unit 200 through a communicator 410. Based on the received data, a controller 420 of the server 500 may calculate amount of power loss in each element, amount of variation in power loss in each element, amount of power loss in a harmonic filter, amount of variation in power loss in a harmonic filter.

Meanwhile, the server 500 may include a display (not shown), and the server 500 may output, through the display (not shown), at least one of the following: a voltage value of each element, a current value of each element, temperature of each element, an impedance value of each element, amount of variation in impedance of each element, power loss in each element, amount of variation in power loss in each element, power loss in a harmonic filter, variation in power loss in the harmonic filter.

As described above, the power loss measuring system according to an embodiment of the present disclosure does not measure an entire power loss in a harmonic filter, but measure power loss in each element of the harmonic filter, so that it enables accurate monitoring of the power loss and reflect the monitoring result in designing a configuration and specifications of the harmonic filter In addition, the power loss measuring system according to an embodiment of the present disclosure is able to precisely measure power loss relative to variation in impedance according to an applied voltage, current, temperature, and frequency.

In addition, the power loss measuring system according to an embodiment of the present disclosure measures amount of power loss by measuring amount of variation in impedance of each element, and thus it is easy to measure amount of power loss than the case where a power is measured by measuring a voltage value and a current value of each element.

Meanwhile, the controller 300 is a configuration generally in charge of controlling a device, and may be the same as a Central Processing Unit (CPU), a microprocessor, and a processor.

The methods and/or operations described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. Examples of computer-readable storage media include Hard Disk Drive (HDD), Solid State Disk (SSD), Silicon Disk Drive (SDD), flash drive, read-only memory (ROM), random access memory (RAM), CD-ROM, magnetic tape, floppy disks, and optical data storage device. In addition, the computer may include a controller 180 of a terminal. Therefore, the above descriptions should not be understand in a limited range, but they should be considered examples. The scope of the disclosure should be determined by reasonable interpretation of the following claims, and the disclosure is to cover all modifications, equivalents, and alternatives falling within the spirit and scope of the disclosure as defined by the claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A power loss measuring system for measuring power loss in a harmonic filter included in a High Voltage Direct Current (HVDC) transmission system, wherein the HVDC transmission system converts AC power into DC power and converts DC power into AC power, the power loss measuring system comprising:
   a harmonic filter including a plurality of elements, wherein the harmonic filter is configured to remove a harmonic wave that is generated at the HVDC transmission system;
   a monitoring sensor unit configured to sense a variation in impedance of each of the plurality of elements; and
   a controller configured to obtain a power loss in the harmonic filter, based on a rated voltage or a rated current of each of the plurality of elements, and an amount of variation in impedance of each of the plurality of elements.

2. The power loss measuring system of claim 1, wherein:
   the plurality of elements comprises at least one resistor, at least one capacitor, and at least one inductor;
   the monitoring sensor unit is further configured to sense the variation in impedance of each of the at least one resistor, the at least one capacitor, and the at least one inductor; and
   the controller is further configured to detect power loss occurring in each of the at least one resistor, the at least one capacitor, and the at least one inductor based on the amount of variation in impedance of each of the at least one resistor, the at least one capacitor, and the at least one inductor.

3. The power loss measuring system of claim 2, wherein the monitoring sensor unit is further configured to obtain the amount of variation in impedance using an impedance value, which is sensed by the monitoring sensor unit, and an initial impedance value of each of the at least one resistor, the at least one capacitor, and the at least one inductor.

4. The power loss measuring system of claim 1, wherein the controller is further configured to obtain the power loss in the harmonic filter using variation in impedance of each of the plurality of elements and at least one of a rated voltage and a rated current of each of the plurality of elements.

5. The power loss measuring system of claim 4, wherein the rated voltage of each of the plurality of elements is a fixed value.

6. The power loss measuring system of claim 1, wherein the controller comprises a communication module configured to communicate with a server, calculate at least one of an amount of the power loss in each of the plurality of elements or an amount of the power loss in the harmonic filter based on the amount of variation in impedance of each of the plurality of elements, and transmit the at least one of the amount of the power loss in each of the plurality of elements or the amount of the power loss in the harmonic filter via the communication module to the server.

7. The power loss measuring system of claim 1, wherein the monitoring sensor unit comprises a communication module configured to communicated with a server and transmits the amount of variation in impedance of each of the plurality of elements via the communication module to the server.

8. The power loss measuring system of claim 1, further comprising a storage,
wherein the controller is further configured to store, in the storage, at least one of an initial impedance value of each of the plurality of elements, amount of variation in impedance of each of the plurality of elements, an amount of power loss occurring in each of the plurality of elements, or an amount of power loss occurring in the harmonic filter.

9. The power loss measuring system of claim 1,
wherein the monitoring sensor unit is further configured to sense an impedance value of each of the plurality of elements and transmit the sensed impedance value of each of the plurality of elements to the controller, and
wherein the controller is further configured to calculate the amount of variation in impedance of each of the plurality of elements based on the received impedance value of each of the plurality of elements.

10. A power loss measuring method for a power loss measuring system for measuring power loss in a harmonic filter included in a High Voltage Direct Current (HVDC) transmission system, wherein the HVDC transmission system converts AC power into DC power and converts DC power into AC power, and wherein the harmonic filter removes a harmonic wave that is generated at the HVDC transmission system, the power loss measuring method comprising:
sensing impedance values of each of a plurality of elements included in the harmonic filter;
obtaining a variation in impedance of each of the plurality of elements; and
obtaining a power loss in the harmonic filter, based on a rated voltage or a rated current of each of the plurality of elements, and an amount of variation in impedance of each of the plurality of elements.

11. The power loss measuring method of claim 10, wherein:
the plurality of elements comprises at least one resistor, at least one capacitor, and at least one inductor;
obtaining the variation in impedance of each of the plurality of elements comprises calculating variation in impedance of each of the at least one resistor, the at least one capacitor, and the at least one inductor; and
obtaining the power loss in the harmonic filter comprises calculating power loss occurring in each of the at least one resistor, the at least one capacitor, and the at least one inductor based on the amount of variation in impedance of each of the at least one resistor, the at least one capacitor, and the at least one inductor.

12. The power loss measuring method of claim 11, wherein obtaining the variation in impedance of the plurality of elements comprises calculating the amount of variation in impedance based on an initial impedance value and a sensed impedance value of each of the at least one resistor, the at least one capacitor, and the at least one inductor.

13. The power loss measuring method of claim 10, wherein obtaining the power loss in the harmonic filter comprises obtaining the power loss in the harmonic filter based on variation in impedance of each of the plurality of elements and at least one of a rated voltage and a rated current of each of the plurality of elements.

14. The power loss measuring method of claim 13, wherein the rated voltage of each of the plurality of elements is a fixed value.

15. The power loss measuring method of claim 10,
wherein obtaining the power loss in the harmonic filter using the variation in impedance of each of the plurality of elements comprises calculating, based on the amount of variation in impedance of each of the plurality of elements, at least one of amount of power loss of each of the plurality of elements or amount of power loss in the harmonic filter, and
wherein the power loss measuring method further comprises transmitting at least one of the amount of the power loss in each of the plurality of elements and the amount of the power loss in the harmonic filter to a server.

16. The power loss measuring system of claim 10, further comprising: transmitting the amount of the variation in impedance of each of the plurality of elements to a server.

17. The power loss measuring method of claim 10, further comprising:
storing an initial impedance value of each of the plurality of elements;
storing amount of variation in impedance of each of the plurality of elements; and
storing at least one of amount of power loss in each of the plurality of elements and amount of power loss in the harmonic filter.

18. The power loss measuring method of claim 10,
wherein sensing the impedance values of each of the plurality of elements included in the harmonic filter comprises operations, performed by a monitoring sensor unit of the power loss measuring system, of sensing an impedance value of each of the plurality of elements and transmitting the sensed impedance value of each of the plurality of elements, and
wherein obtaining the variation in impedance of the plurality of elements comprises an operation, performed by a controller of the power loss measuring system, of calculating amount of the variation in impedance of each of the plurality of elements based on the received impedance value of each of the plurality of elements.

* * * * *